United States Patent [19]
Hashimoto et al.

[11] Patent Number: 5,130,679
[45] Date of Patent: Jul. 14, 1992

[54] ULTRASONIC DELAY LINE MOUNTED IN A FRAME-LIKE BODY HAVING A WIRING PATTERN THEREON

[75] Inventors: Haruto Hashimoto, Funabashi; Etsuji Kimura, Kamakura; Yutaka Igarashi, Funabashi, all of Japan

[73] Assignee: Asahi Glass Company Ltd., Tokyo, Japan

[21] Appl. No.: 653,751

[22] Filed: Feb. 11, 1991

Related U.S. Application Data

[63] Continuation of Ser. No. 275,752, Nov. 23, 1988, abandoned.

[30] Foreign Application Priority Data

Nov. 26, 1987 [JP] Japan .............................. 62-178804[U]
Jun. 14, 1988 [JP] Japan .............................. 63-77770[U]

[51] Int. Cl.$^5$ .............................. H03H 9/05; H03H 9/30
[52] U.S. Cl. .............................. 333/141; 333/149; 310/348; 174/52.3
[58] Field of Search .............................. 333/140, 141, 149, 187; 310/348, 344, 352, 353, 334, 313 R; 174/52.4, 52.5, 50.54, 50.64

[56] References Cited

U.S. PATENT DOCUMENTS

| | | | |
|---|---|---|---|
| 3,349,481 | 10/1967 | Karp | 174/52.4 X |
| 3,970,880 | 7/1976 | Deutschmann et al. | 310/353 X |
| 4,516,090 | 5/1985 | Kambara et al. | 333/141 |
| 4,533,976 | 8/1985 | Suwa | 361/413 X |
| 4,684,843 | 8/1987 | Ohya et al. | 310/348 X |
| 4,742,182 | 5/1988 | Fuchs | 174/52.4 |
| 4,855,808 | 8/1989 | Tower et al. | 174/52.4 X |

FOREIGN PATENT DOCUMENTS

| | | | |
|---|---|---|---|
| 63217 | 4/1983 | Japan | 333/141 |
| 17715 | 1/1984 | Japan | 333/187 |
| 176319 | 9/1985 | Japan | 333/149 |
| 264108 | 12/1985 | Japan | 333/187 |
| 274416 | 12/1986 | Japan | 333/141 |
| 16515 | 1/1987 | Japan | 333/141 |
| 241419 | 10/1987 | Japan | 333/141 |
| 281505 | 12/1987 | Japan | 333/187 |
| 104512 | 5/1988 | Japan | 333/187 |
| 238709 | 10/1988 | Japan | 333/141 |
| 1381395 | 1/1975 | United Kingdom . | |
| 1496067 | 12/1977 | United Kingdom . | |
| 2120038 | 11/1983 | United Kingdom . | |

*Primary Examiner*—Eugene R. Laroche
*Assistant Examiner*—Benny Lee
*Attorney, Agent, or Firm*—Oblon, Spivak, McClelland, Maier & Neustadt

[57] ABSTRACT

An ultrasonic delay line comprises a delay medium provided with transducers on at least a side surface thereof, an insulating substrate having a frame-like body in which a wiring pattern is print-formed and an opening having substantially the same shape as the outer configuration of the delay medium, the delay medium being fitted in the opening so that an electrode of the transducer is electrically connectable with the wiring pattern, and a packaging member covering at least a part of major surfaces of the insulating substrate and the delay medium so as to secure the two.

5 Claims, 4 Drawing Sheets

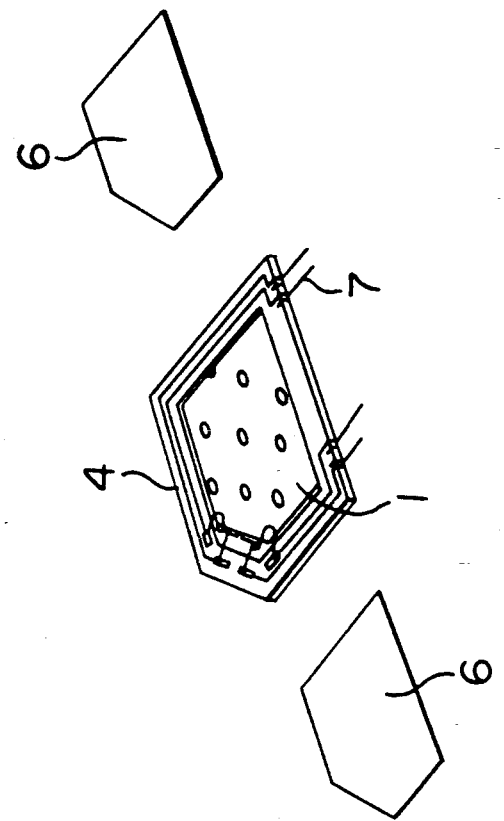
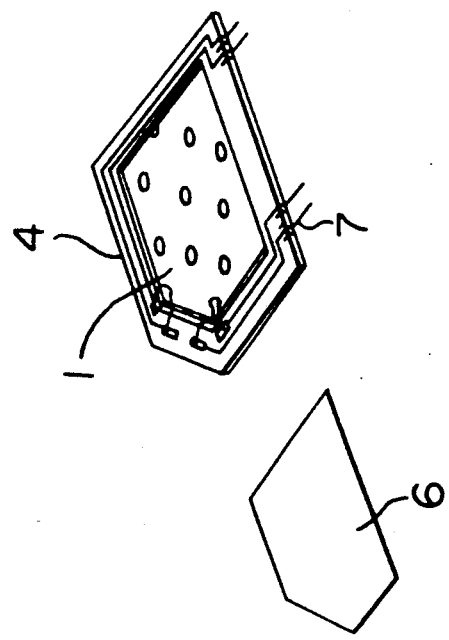
FIGURE 2

FIGURE 3
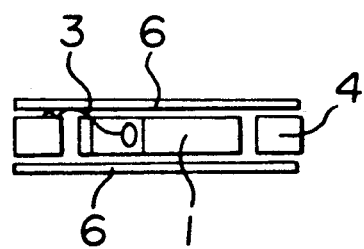
FIGURE 4
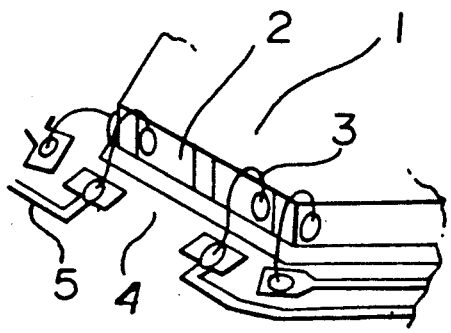
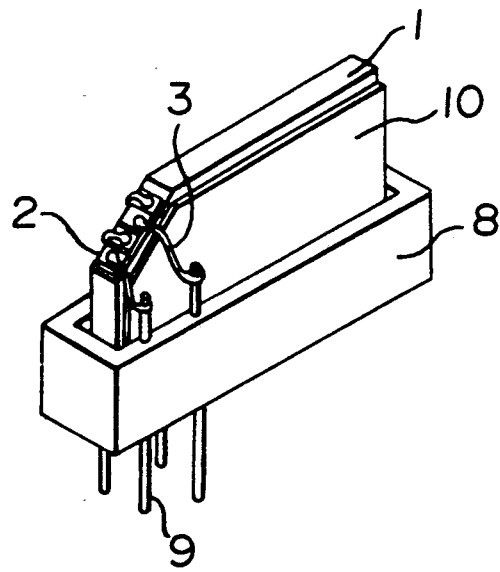
FIGURE 5
PRIOR ART

ULTRASONIC DELAY LINE MOUNTED IN A FRAME-LIKE BODY HAVING A WIRING PATTERN THEREON

This application is a continuation of application Ser. No. 07/275,752, filed on Nov. 23, 1988, now abandoned.

The present invention relates to an ultrasonic delay line. More particularly, it relates to an ultrasonic delay line in which a way of mounting a delay medium is contrived to obtain a thin, light product.

FIG. 5 shows a conventionally used typical ultrasonic delay line. A pair of transducers 2 for effecting electric-ultrasonic conversion and two pairs of lead wires 3 connected to the transducer 2 are provided at a side surface of a delay medium made of a material such as glass. The delay medium 1 is mounted on a lower casing 8 through a shock absorbing material 10 which is to prevent damage to the two major surfaces of the delay medium 1 due to contact with the lower casing 8. Terminal pins 9 are used for connection to other circuits and are provided through lower casing 8, and one end of each of the terminal pins 9 is connected to a lead wire 3 by soldering.

The conventional ultrasonic delay line has disadvantages in that the thickness of the device is large and the weight is heavy because the device is constructed by fitting an upper casing to the lower casing. In the case that a plurality of delay media are to be received in the casing assembly to thereby provide a multi-functioning ultrasonic delay line, a special casing for the devices exclusive use is required. Therefore, the manufacturing cost increases as does the time to prepare metal dies for the casing. Thus, when the ultrasonic delay line having a multi-function is to be manufactured, the outer dimension must be increased in the direction of the thickness and the weight is also increased in comparison with the product as shown in FIG. 5. Recently, it has become advantageous to make ultrasonic delay lines as electronic devices as thin and light as possible because apparatuses such as one-piece body type VTRs including a camera and other appliances employ these devices.

It is an object of the present invention to provide a thin, light weight type ultrasonic delay line by mounting a delay medium to an insulating substrate having a printed wiring.

In an aspect of the present invention, there is provided an ultrasonic delay line which comprises a delay medium provided with a transducer on a side surface thereof, an insulating substrate having a frame-like body on which a wiring pattern is print-formed and an opening having substantially the same shape as the outer configuration of the delay medium, the delay medium being fitted in the opening so that an electrode of the transducer is electrically connectable with the wiring pattern. A packaging member covers at least a part of major surfaces of the insulating substrate and the delay medium so as to secure the device.

In another embodiment of the present invention, there is provided an ultrasonic delay line wherein a plurality of units are placed one on top of another, each comprising a delay medium provided with a transducer on a side surface thereof and an insulating substrate having a frame-like body in which a wiring pattern is print-formed and an opening having substantially the same shape as the outer configuration of the delay medium, the delay medium being fitted in the opening so that an electrode of the transducer is electrically connectable with the wiring pattern. A packaging member covers at least a part of major surfaces of the insulating substrate and the delay medium in the each unit so as to secure the device.

BRIEF DESCRIPTION OF THE DRAWINGS

FIG. 2 is a perspective view in a disassembled state of another embodiment of the two-layered ultrasonic delay line according to the present invention;

FIG. 3 is a cross-sectional view of the ultrasonic delay line shown in FIG. 1;

FIG. 4 is an enlarged perspective view partly omitted which shows a lead wire connecting part in the ultrasonic delay line shown in FIGS. 1 and 2;

FIG. 5 is a perspective view of a conventional ultrasonic delay line;

DETAILED DESCRIPTION OF THE DRAWINGS

Figure 1:
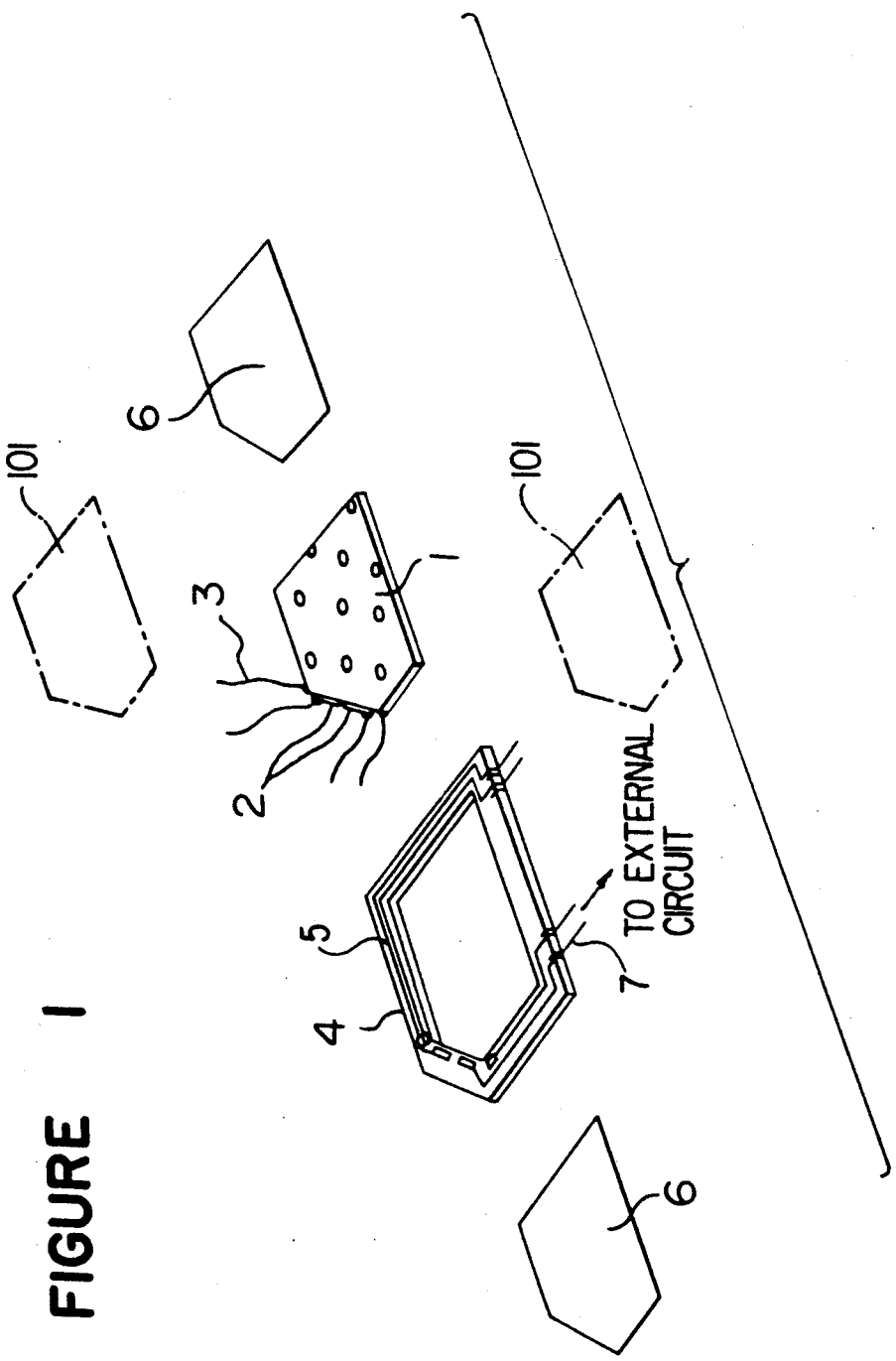
FIG. 1 is a perspective view in a disassembled state of an embodiment of the ultrasonic delay line according to the present invention.

Preferred embodiments of the ultrasonic delay line of the present invention will be described with reference to FIGS. 1 to 4, wherein the same reference numerals as in FIG. 5 designate the same or corresponding parts.

With reference to FIGS. 1, 3 and 4 which show the first embodiment of the present invention, a delay medium 1 is made of a material such as glass, and transducers 2 for effecting an electric-ultrasonic conversion and lead wires 3 connected to the transducers 2 are provided on a side surface of the delay medium 1. An insulating substrate 4 is made of a material such as glass epoxy resin, paper epoxy resin or paper phenol resin. The insulating substrate 4 is provided with terminals to be connected to the lead wires 3, a wiring pattern and lead frame terminals 7 to be connected to an outer circuit. The insulating substrate 4 is so formed as to have a frame-like body in which an opening of the same configuration as or of a configuration greater than the outer configuration of the delay medium 1 so that the delay medium 1 can be fitted in the opening. As can be seen in FIG. 4 one end of each of the lead wires 3 is connected by soldering to a terminal of the print-formed wiring 5 on the insulating substrate 4. The lead wires 3 may be replaced by projections of an electric conductive material such as metal which are formed at the free ends terminals of the print-formed wiring 5 so that the projections can be electrically connected to the electrodes of the transducers by soldering or by use of an electric conductive resin.

Then, the two major surfaces of the delay medium 1 are covered respectively by two sheet-like packaging materials 6 made of a sheet-like material such as synthetic paper so that side surfaces of the insulating substrate 4 and the delay medium 1 are packaged and fixed to each other. An adhesive agent or an adhesive tape may be applied to a circumferential portion of the packaging materials 6 so that it is bonded to the insulating substrate 4 for fixing. A shock absorbing material such as polyester or the like 101 may be interposed between the delay medium 1 and the packaging material 6, if necessary (for example see FIG. 1.).

In the above-mentioned embodiment, the packaging materials 6 having a size to cover a part of the major surfaces of the delay medium 1 is used. However, the packaging materials having a size to cover the entire surfaces of the insulating substrate 4 and the delay medium 1 may be used. Further, although a wiring pattern having two lead frame terminals 7 at two different portions is formed in the above-mentioned embodiment, a wiring pattern having four lead frame terminals at a single portion may be used. In this case, the wiring pattern may be formed by printing at the two major surfaces of each of the insulating substrates 4.

In the above-mentioned embodiment, the shape of the opening formed in the insulating substrate 4 is the same as that of the delay medium 1, namely, a pentagonal shape. However, it is not always necessary to form the shape of the opening in conformity with the shape of the delay medium 1. For instance, a rectangular shape may be used for the opening of the insulating substrate as long as the delay medium can be fixed. The outer configuration of the insulating substrate may also be rectangular.

Another embodiment of the ultrasonic delay line of the present invention will be described with reference to FIG. 2. In FIG. 2, two units, each comprising the delay medium 1 fitted in the insulating substrate 4, are placed one on top of another to thereby provide a multifunctional devise. The two stage structure body is fixed by means of the packaging materials 6 which are respectively provided with an adhesive agent or an adhesive tape at the circumferential portion. With the above-mentioned construction, a 2H element (which has for example a delay time which corresponds to a time required to scan two horizontal scanning lines in a TV) can be formed by combining two sets of a 1H element (which is an element having a delay time which corresponds to a time required to scan one horizontal scanning line in the TV), or a combination of the 1H element and the 2H element can be obtained. The number of delay media to be stacked can be selected as desired.

In the above-mentioned embodiment, the packaging materials 6 having a size sufficient to cover the two major surfaces of the delay media 1 is used. However, it is possible to use the packaging materials 6 having a size sufficient to cover the entire surfaces of the insulating substrates 4 and the delay media 1. A shock absorbing material or materials made of a material such as polyester may be interposed between the delay media 1 and the packaging material 6, if necessary.

In the second embodiment of the present invention each of the insulating substrates is provided with a wiring pattern in which two lead frame terminals 7 are formed at two different portions. However, four lead frame terminals may be provided at a single portion. In this case, the wiring pattern may be formed by printing at the two major surfaces of each of the insulating substrates 4.

Figure 6:
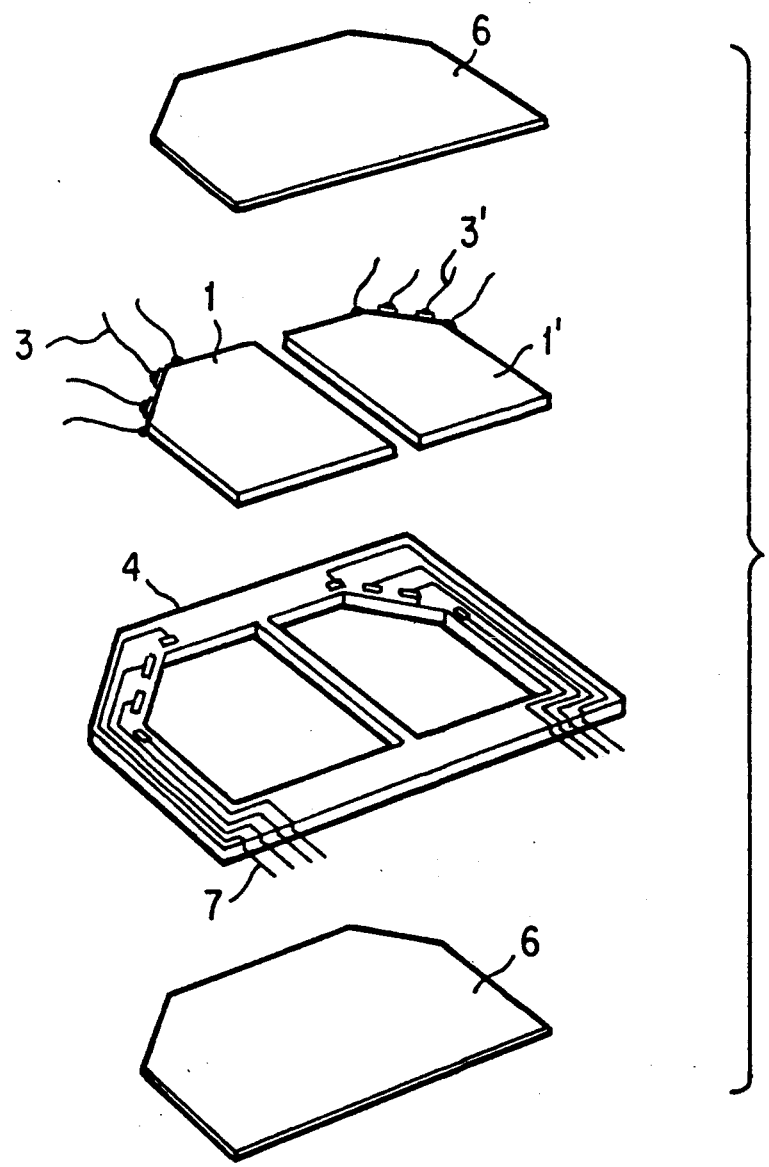
FIG. 6 is a perspective view, in a disassembled state of yet another embodiment of the ultrasonic delay line according to the present invention.

As an alternative embodiment, a construction that two delay media are fitted in a single thick insulating substrate 4, and packaging materials are attached to both surfaces of the insulating substrate 4 may be used. In this case, a packaging material or a shock absorbing material may be interposed between two delay media. Further, a construction that two openings are formed in a single insulating substrate, and each delay medium fitted to each of the openings may be used such as is shown in FIG. 6 wherein the reference numerals are similar to the reference numerals used in FIG. 1.(1' is an additional element and 3' are its electrodes)

Thus, in accordance with the present invention, a thin and light ultrasonic delay line can be obtained by fitting a delay medium or media in a insulating substrate or substrates having an opening or openings which is or are sufficient to hold the delay medium or media, and by electrically connecting electrodes of transducers to terminals formed at the end portion of a printed wiring pattern on the insulating substrate or substrates.

Specifically, in accordance with the present invention, an ultrasonic delay line having a thickness of 1 mm-3 mm and a weight of 2 gr-3 gr can be obtained, whereas a conventional ultrasonic delay line for a type as shown in FIG. 5 has a thickness of 5 mm-7 mm and a weight of 5 gr-6 gr.

In a conventional ultrasonic delay line having the construction that two delay media are contained, the thickness is in a range from 6 mm to 9 mm and the weight is in a range from 6 gr to 10 gr. However, in accordance with the ultrasonic delay line of the present invention, the thickness can be in a range from 2 mm to 5 mm and the weight can be in the range from 4 gr to 6 gr. Accordingly, the thickness and weight can be considerably reduced. Further, it is possible to provide a ultrasonic delay line which has more functions by increasing the number of the delay media which are placed one on top of another.

We claim:

1. An ultrasonic delay line comprising:
   a plurality of glass delay mediums, each delay medium having a shape defined by an outer configuration with input and output transducers, each transducer comprising electrodes, each electrode disposed on a side surface of a respective delay medium;
   an insulating substrate having surfaces and a frame-like body;
   a conductive wiring pattern print formed along a top surface of said frame-like body;
   an opening in said frame-like body having a shape which matches the shape of the outer configurations of all of said of delay mediums,
   wherein the insulating substrate has said plurality of delay mediums being fitted in said frame-like body such that said electrodes of the input and output transducers are connected electrically with said wiring pattern and said plurality of delay mediums are interconnected by said wiring pattern so as to provide a delay mechanism for signals and such that the packaging member covers at least a part of the surfaces of said insulating substrate and the plurality of said delay mediums so as to secure the insulating substrate to said delay medium.

2. An ultrasonic delay line wherein a plurality of individual delay units are placed one on top of another, each of said units comprising:
   a glass delay medium having a shape defined by an outer configuration provided with input and output transducers, having electrodes, on at least a side surface thereof;
   an insulating substrate having surfaces and a frame-like body;
   a conductive wiring pattern print-formed on at least a top surface of said frame-like body and wherein an opening is formed in said frame-like body which has substantially the same shape as the outer configuration of said delay medium;
   said delay medium being fitted in said opening so that said electrodes of said input and output transducers are connected electrically with said wiring pattern, and a packaging member covers at least a part of the surfaces of the insulating substrate and the delay medium in said each unit so as to secure the insulating substrate to the delay medium; and wherein said delay units are connected one to another so as to increase the amount of delay provided thereby.

3. An ultrasonic delay line which comprises:

a glass delay medium having *a shape defined by* an outer configuration provided with input and output transducers, having electrodes, on at least a side surface thereof, an insulating substrate having surfaces and a frame-like body;

a conductive wiring pattern print-formed along a top surface of said frame-like body; and an opening in said frame-like body having *a shape which is* substantially the same shape as the outer configuration of said delay medium, said delay medium being fitted in said opening so that said electrodes of said *input and output* transducers are connected electrically with said conductive wiring pattern, and a packaging member covering at least a part of the surfaces of said insulating substrate and said delay medium so as to secure the insulating substrate to the delay medium.

4. The ultrasonic delay line according to claim 3, wherein a shock absorbing material is interposed between said delay medium and said packaging member.

5. The ultrasonic delay line according to claim 3, wherein a terminal is formed on said insulating substrate for providing a connection point with an outside circuit which is connected to said wiring pattern.

* * * * *